US006933782B1

(12) United States Patent
Lu

(10) Patent No.: US 6,933,782 B1
(45) Date of Patent: Aug. 23, 2005

(54) DEGENERATIVE INDUCTOR-BASED GAIN EQUALIZATION

(75) Inventor: Jinghui Lu, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/956,966

(22) Filed: Oct. 1, 2004

Related U.S. Application Data

(60) Division of application No. 10/346,704, filed on Jan. 17, 2003, now Pat. No. 6,812,872, which is a continuation-in-part of application No. 10/043,771, filed on Jan. 9, 2002, now Pat. No. 6,611,218.

(51) Int. Cl.[7] ................................. H03F 3/45
(52) U.S. Cl. ..................... 330/253; 341/101; 327/156
(58) Field of Search ................. 330/253, 311; 327/156; 341/101

(56) References Cited

U.S. PATENT DOCUMENTS

| | | | |
|---|---|---|---|
| 4,381,487 A * | 4/1983 | Erickson | ...................... 330/306 |
| 4,418,418 A | 11/1983 | Aoki | |
| 4,523,462 A | 6/1985 | Kolodjski | |
| 5,162,674 A | 11/1992 | Allstot et al. | |
| 5,365,150 A * | 11/1994 | Shiomi et al. | .......... 315/209 R |
| 5,369,313 A | 11/1994 | Yoshihara | |
| 5,696,460 A | 12/1997 | Cameron | |
| 5,909,187 A | 6/1999 | Ahuja | |
| 6,018,253 A | 1/2000 | Wendell | |
| 6,057,714 A * | 5/2000 | Andrys et al. | ............... 327/105 |
| 6,066,993 A | 5/2000 | Yamamoto et al. | |
| 6,417,737 B1 * | 7/2002 | Moloudi et al. | ............. 330/301 |
| 6,486,694 B1 | 11/2002 | Kirichenko | |
| 6,525,565 B2 | 2/2003 | Young et al. | |
| 6,611,218 B1 | 8/2003 | Lu et al. | |
| 6,661,270 B2 | 12/2003 | Nagata | |

OTHER PUBLICATIONS

Roland Antheunis and InSun van Loo; "Simple Scalable CMOS Linear Regulator Architecture"; pp. 1-4.

Gijung Ahn, Deog-Kyoon Jeong, and Gyudong Kim; "A 2-Gbaud 0.7-V Swing Voltage-Mode Driver and On-Chip Terminator for High-Speed NRZ Data Transmission"; IEEE Journal of Solid-State Circuits, vol. 35, No. 6; Jun. 2000; pp. 915-918.

R. Sekhar Narayanaswami; "The Design of a 1.9GHz 250mW CMOS Power Amplifier for DECT"; Chapters 1-6; pp. 1-68.

Sunderarajan S. Mohan, Maria del Mar Hershenson, Stephen P. Boyd, and Thomas H. Lee; "Bandwidth Extension in CMOS with Optimized On-Chip Inductors"; Electrical Engineering Department, Stanford University, CA; pp. 1-37.

* cited by examiner

*Primary Examiner*—Patricia Nguyen
(74) *Attorney, Agent, or Firm*—Arthur Joseph Behiel; Kim Kanzaki

(57) ABSTRACT

Described are high-speed parallel-to-serial converters. The converters include data combiners with differential current-steering circuits that respond to parallel data bits by producing complementary current signals representing a differential, serialized version of the parallel data bits. One embodiment includes inductive and resistive loads to equalize the gain over the frequency of interest to reduce data-deterministic jitter.

9 Claims, 7 Drawing Sheets

DEGENERATIVE INDUCTOR-BASED GAIN EQUALIZATION

This application is a division of Ser. No. 10/346,704 filed Jan. 17, 2003 now U.S. Pat. No. 6,812,872, which is a continuation-in-part of Ser. No. 10/043,771 filed Jan. 9, 2002 now U.S. Pat. No. 6,611,218.

BACKGROUND

Modern digital systems represent digital data either in series (i.e., as a series of bits) or in parallel (i.e., as a transmitting one or more bytes simultaneously using multiple data lines). While it is generally easier to store and manipulate data in parallel, it is often beneficial to transmit data in series. Many systems therefore employ parallel-to-serial converters.

FIG. 1 (prior art) depicts a parallel-to-serial converter 100 that serializes ten-bit words presented in parallel on data lines D<9:0>. Converter 100 includes a parallel shifter 105, which in turn includes a pair of five-bit shift registers 110 and 115. Shift registers 110 and 115 each connect to one of a pair of complementary clocks $C_{EV}$ and $C_{OD}$. Designations $C_{EV}$ and $C_{OD}$ stand for "clock even" and "clock odd," respectively, because even data bits are presented on an output terminal $D_{OUT}$ when $C_{EV}$ is high and odd data bits are presented on output terminal $D_{OD}$ when $D_{EV}$ is high.

Every fifth rising edge of clock $C_{EV}$, register 110 stores the even-numbered data bits D<8,6,4,2,0> presented on bus D<9:0> and register 115 stores the odd-numbered data bits D<9,7,5,3,1> presented on the same bus. Each of registers 110 and 115 then presents their respective data one bit at a time, so that both odd and even data bits are presented alternately to a data combiner 120. Data combiner 120 alternately gates the odd and even data bits presented on respective data terminals $D_{OD}$ and $D_{EV}$ to produce a serialized version of the data produced by shifter 105.

If manufactured using commonly available CMOS processes, converter 100 can perform with clock frequencies as high as about 2 Ghz. This is too slow for many modern high-speed digital communication systems, which can transmit serial data in the 10 Gb/s range. More exotic processes, such as those employing silicon germanium or gallium arsenide, provide improved high-frequency response; unfortunately, this improvement comes at considerable expense.

SUMMARY

The present invention is directed to differential circuits capable of operating at speeds sufficient to meet the needs of modern communication systems without consuming excessive power or requiring complex and expensive fabrication technologies. Converters in accordance with the invention include data combiners—a type of differential amplifier—that employ current sources and differential current-steering circuits. The current-steering circuits respond to parallel data bits by producing complementary current signals representing a differential, serialized version of the parallel data bits. One embodiment of the invention includes complementary data-input transistors to expedite the data combiner's response to changes in input data. Yet another embodiment includes inductive and resistive loads to equalize the gain over the frequency of interest to reduce data-deterministic jitter.

This summary does not define the scope of the invention, which is instead defined by the allowed claims.

DETAILED DESCRIPTION

Figure 1:
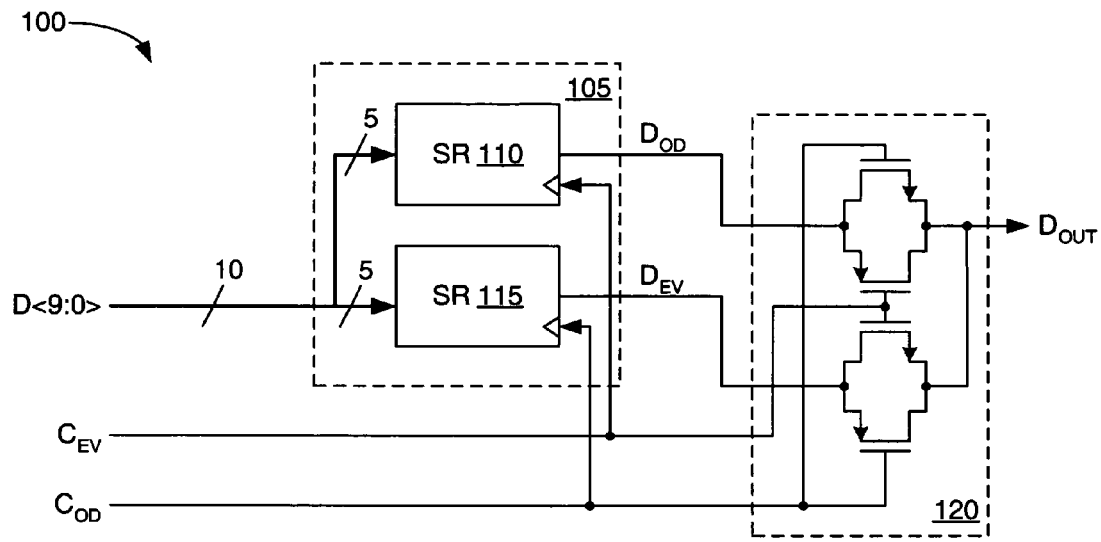
FIG. 1 (prior art) depicts a parallel-to-serial converter 100 that serializes converts ten-bit words presented in parallel on data lines D<9:0>.
Figure 2A:
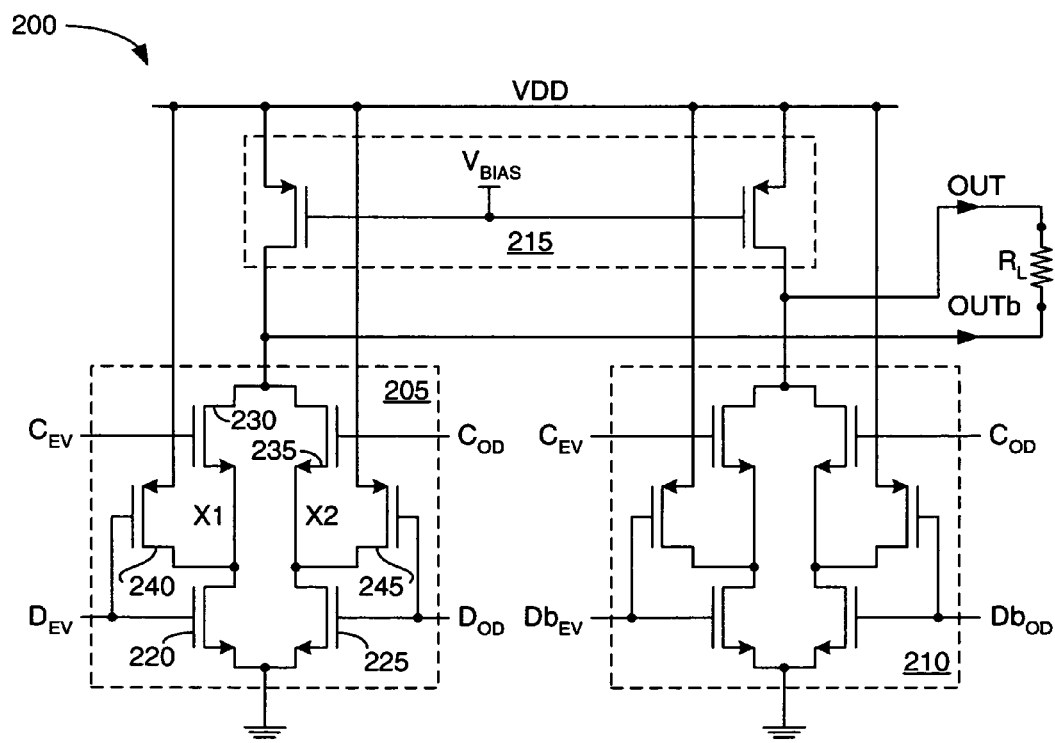
FIG. 2A depicts a data combiner 200 in accordance with one embodiment of the invention.

FIG. 2A depicts a data combiner 200 in accordance with one embodiment of the invention. Data combiner 200, a type of differential amplifier, serializes two-bit data bytes at a rate far greater than can be achieved using data combiner 120 of FIG. 1. Data combiner 200 includes a pair of current-steering circuits 205 and 210, each of which receives a pair of complementary clock signals $C_{OD}$ and $C_{EV}$. Steering circuit 205 steers current from a current source 215 to an output terminal OUTb and from output terminal OUTb to ground in response to even and odd data signals $D_{EV}$ and $D_{OD}$. The steered current represents a serialized version of data signals $D_{EV}$ and $D_{OD}$; similarly, steering circuit 210 receives the complements $D_{EV}$ and $D_{OD}$ of respective even and odd data signals $D_{EV}$ and $D_{OD}$ to produce a serialized version of these data signals on an output terminal OUT. The serialized data signals on lines OUT and OUTb are complementary; signal designations terminating in a lower-case "b" identify active-low signals. Data combiner 200 drives a load, represented as a resistor $R_L$, by steering current between output terminals OUT and OUTb in either direction.

Steering circuit 205 includes a pair of differential NMOS input transistors 220 and 225 having their respective control terminals (gates) tied to data terminals $D_{EV}$ and $D_{OD}$. Steering circuit 205 also includes a pair of differential NMOS input transistors 230 and 235 having their respective control terminals tied to respective complementary clock terminals $C_{EV}$ and $C_{OD}$. Finally, circuit 205 includes a pair of PMOS transistors 240 and 245 having their respective control terminals connected to respective data terminals $D_{EV}$ and $D_{OD}$. Complementary transistors 220 and 240 form an inverter that connects between input terminal $D_{EV}$ and output terminal OUTb via transistor 230. Steering circuits 205 and 210 are structurally identical, so a detailed discussion of steering circuit 210 is omitted for brevity.

Figure 2B:
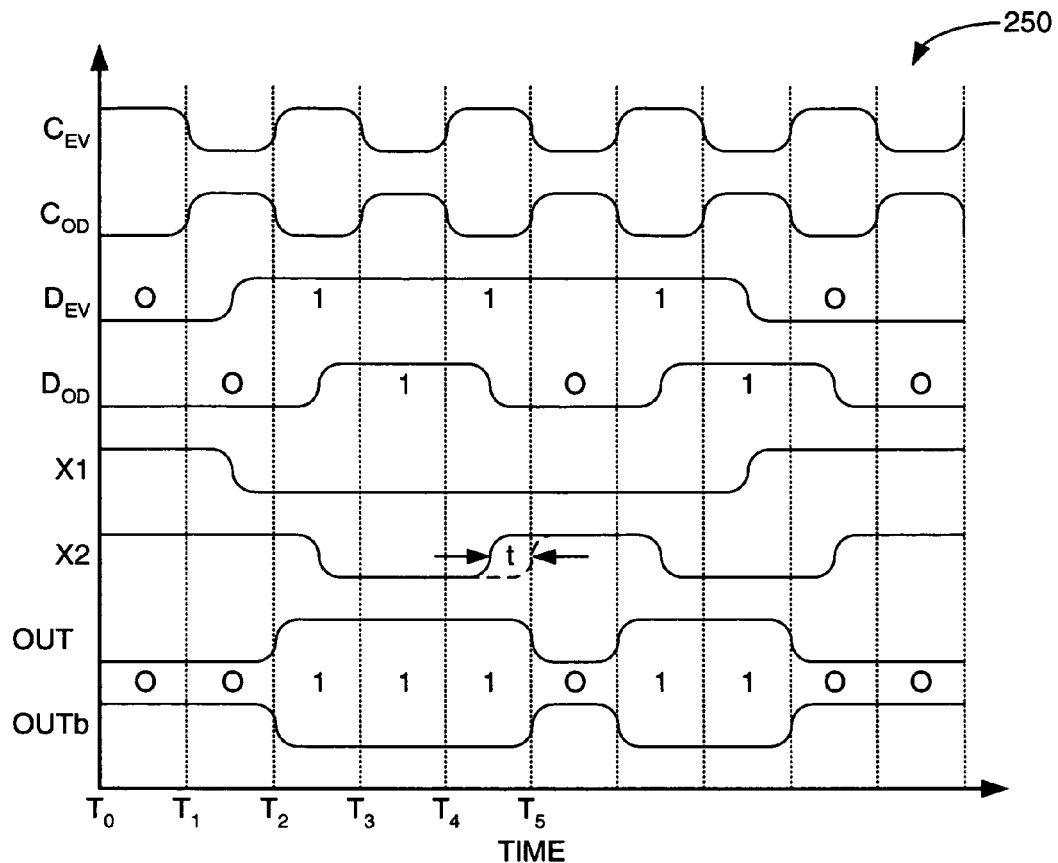
FIG. 2B is a timing diagram 250 depicting the operation of current-steering circuit 205 of FIG. 2A.

FIG. 2B is a timing diagram 250 depicting the operation of current-steering circuit 205 of FIG. 2A. Diagram 250 assumes two arbitrary even and odd data streams, received in parallel, to be serialized by data combiner 200. Each signal is identified using the node designation for the corresponding terminal. Whether a given designation refers to a node or a signal will be clear from the context.

Beginning at time T0, the odd and even data signals $D_{EV}$ and $D_{OD}$ are both logic zeroes. Transistors 220 and 225 are therefore biased off and transistors 240 and 245 biased on, so that terminals X1 and X2 both approach power-supply voltage VDD. Clocks $C_{EV}$ and $C_{OD}$ are high and low, respectively (clock $C_{OD}$ is the complement of $C_{EV}$); consequently, transistor 230 is on and transistor 235 is off. Transistor 220 is off, so current-steering circuit 200 steers the current from current source 215 out through terminal OUTb. Since signal OUTb is active low, terminal OUTb expresses a positive (outgoing) current at time T0 to express a logic zero. The logic zero "even" data on terminal $D_{EV}$ is therefore expressed on output terminal OUTb between times T0 and T1.

At time T1, the odd and even data signals $D_{EV}$ and $D_{OD}$ are still both logic zero, but clock signals $C_{EV}$ and $C_{OD}$ reverse. Transistor 235 is therefore biased on and the odd data signal $D_{OD}$ selected to determine the logic level on output terminal OUTb. In this case, the output signal OUTb does not change; however, during this period the "odd" data on terminal $D_{OD}$ is responsible for the logic zero expressed on output terminal OUTb.

Even data signal $D_{EV}$ transitions to a logic one some time between T1 and T2. Transistor 220 responds, pulling terminal X1 toward ground potential. Then, at time T2, clock signal $C_{EV}$ turns on transistor 230 so transistors 230 and 220 steer the current from source 215 to ground and away from output terminal OUTb. Data combiner 200 thus expresses a logic one output signal (recall that OUTb is active low, so a logic one is expressed using a "negative" current on that terminal).

Skipping ahead, the odd data signal $D_{OD}$ changes from a logic one to a logic zero between times T4 and T5. In the absence of transistor 245, terminal X2 would not respond to the change on terminal $D_{OD}$ until transistor 235 turns on again at time T5. Current from current source 215 would then be steered to terminal X2, delaying the state change on output terminal OUTb until after time T5. Such a delay would undesirably slow the operation of data combiner 200. The inclusion of transistor 245 expedites the transition on terminal X2 by connecting terminal X2 to VDD as soon as the data DOD transitions, thus pre-charging terminal X2 a time t before time T5. When transistor 235 turns on, current source 215 does not waste valuable time charging node X2, so output terminal OUTb transitions more rapidly. Transistor 240 provides the same advantage as transistor 245 for data on terminal $D_{EV}$.

Output signals OUT and OUTb are depicted as voltage fluctuations for clarity; however, the logic levels between output terminals OUT and OUTb are primarily expressed using differential currents. The preferred embodiments of the invention use current steering and differential signaling to improve noise immunity and to reduce the voltage swing required to express logic levels. These improvements deliver devices capable of higher data transmission speeds, greater bandwidth, and lower power consumption.

Current-steering circuit 210 functions identically to circuit 205 using complementary data signals. The resulting output signal on terminal OUT is therefore complementary to the signal on terminal OUTb.

Figure 3:
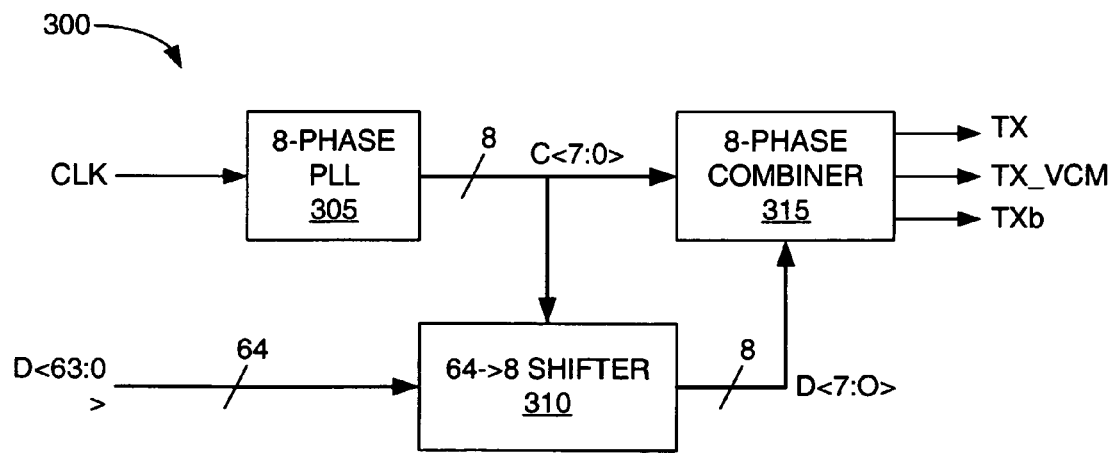
FIG. 3 depicts a parallel-to-serial converter 300 in accordance with another embodiment of the invention.

FIG. 3 depicts a parallel-to-serial converter 300 in accordance with another embodiment of the invention. Converter 200 of FIG. 2 serializes two-bit data; converter 300 of FIG. 3 illustrates how the invention can be extended to serialize data represented using more than 2 bits. Converter 300 illustrates an example that serializes eight-bit data, but the invention can be extended to more or fewer that eight bits.

Converter 300 includes a conventional 8-phase phase-locked loop (PLL) 305 that produces, from a clock signal CLK, eight phase-delayed clocks signals C<7:0>. In one embodiment, the phase difference between clock signals C<7:0> is about 100 picoseconds. Converter 300 also includes a conventional shifter 310 that uses eight shift registers (not shown) and the eight phase-delayed clocks signals C<7:0> to convert each of a series of 64-bit data words on a bus D<63:0> into a series of eight eight-bit data words on a bus D<7:0>. Finally, converter 300 includes a data combiner 315 adapted in accordance with the invention to serialize the eight-bit data on lines D<7:0> using the clock signals on lines C<7:0>. Combiner 315 presents the serialized data as a pair of differential output signals TX and TXb on like-named output terminals. Terminal TX_VCM is the common-mode voltage terminal between the TX and TXb output terminals, and is produced, for example, between a pair of 50-ohm resistors. The common-mode voltage on terminal TX_VCM can be used in a conventional feedback configuration to set the common mode.

Figure 4A:
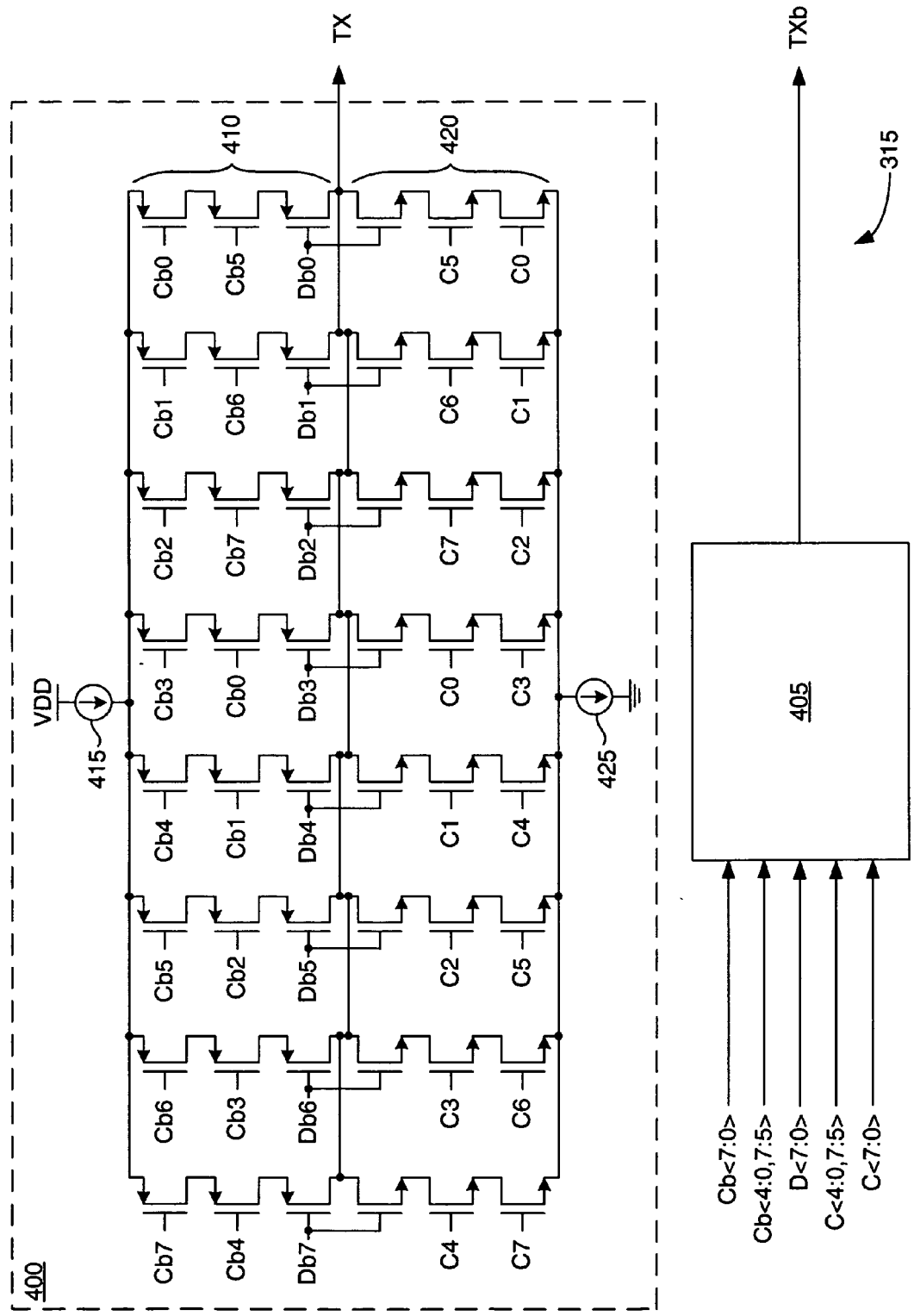
FIG. 4A details an embodiment of data combiner

FIG. 4A details an embodiment of data combiner 315. Data combiner 315 includes a pair of complementary current-steering circuits 400 and 405 that provide respective complementary serialized signals TX and TXb. Circuits 400 and 405 are identical except that they receive complementary data signals to produce their respective complementary output signals. A detailed description of combiner 405 is therefore omitted for brevity.

Current-steering circuit 400 includes PMOS switch network 410 connected between a first current source 415 and output terminal TX and an NMOS switch network 420 connected between a second current source 425 and output terminal TX. Current steering circuit 400 expresses logic ones by directing current from current source 415 through switch network 410 to output terminal TX, and expresses logic zeroes by sinking current from terminal TX through switch network 420 and current source 425.

Figure 4B:
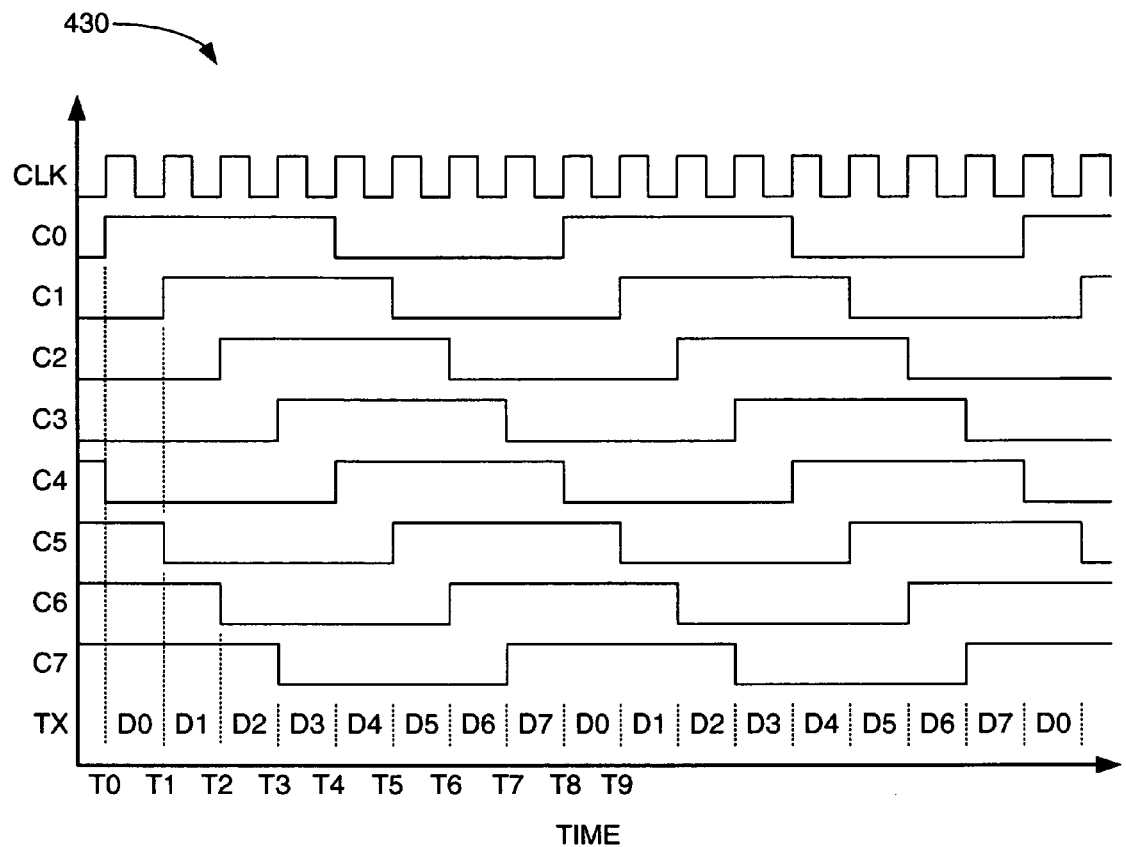
FIG. 4B is a waveform diagram 430 depicting the operation of current-steering circuit 400 of FIG. 4A.

FIG. 4B is a waveform diagram 430 depicting the operation of current-steering circuit 400 of FIG. 4A. Diagram 430 shows clock signal CLK, the eight phase-shifted signals C<7:0>, and a graphical representation of output signal TX. Complementary clock signals Cb<7:0> and complementary output signal TXb are omitted from FIG. 4A.

From time T0 to time T1, clock signals C0 and C5 are both high and their complementary counterparts Cb0 and Cb5 are low. The relative phases of clocks C<7:0> (and their complements) are such that in switch network 410 only the four transistors in the far-right column connected to clock terminals C0, C5, Cb0, and Cb5 are biased on. The two transistors in the same far-right column with their control terminals connected to data terminal Db0 therefore determine the logic level expressed on output terminal TX: if complementary data signal Db0 is a logic zero, the PMOS transistor with its gate connected to terminal Db0 turns on to complete the path for current between current source 415 and output terminal TX; if data signal Db0 is a logic one, the NMOS transistor with its gate connected to terminal Db0 turns on to complete the path for current between output terminal TX and current source 425. Thus, of the eight data signals Db<7:0> presented to steering circuit 400, the output signal TX is determined solely by the level on data terminal Db0 from time T0 to T1. This aspect of circuit 400 is depicted in diagram 430 as the "D0" associated with signal TX, which is to say that output TX reflects that data bit at D0 from time T0 to time T1.

Clock signals C<7:0> combine to form eight unique combinations of clock signals, one combination for each presentation of data D<7:0>. Steering circuit 400 decodes each of the combinations of clock signals to present the eight data bits in series on output terminal TX before a subsequent sequence of eight bits is presented on data terminals D<7:0>.

The second steering circuit 405 is identical to steering circuit 400, except that steering circuit 405 receives data signals D<7:0>, the complement of the data signals Db<7:0> presented to steering circuit 400. Thus configured, steering circuit 405 produces an output signal TXb that is the complement of output signal TX. Thus, when steering circuit 400 provides current from current source 415 to output terminal TX, steering circuit 405 simultaneously sinks current from output terminal TXb through a current source in steering circuit 405 identical to current source 425; similarly, when steering circuit 400 sinks current from output terminal TX via current source 425, steering circuit 405 will simultaneously source current to output terminal TXb via a current source in steering circuit 405 identical to current source 415.

Figure 5:
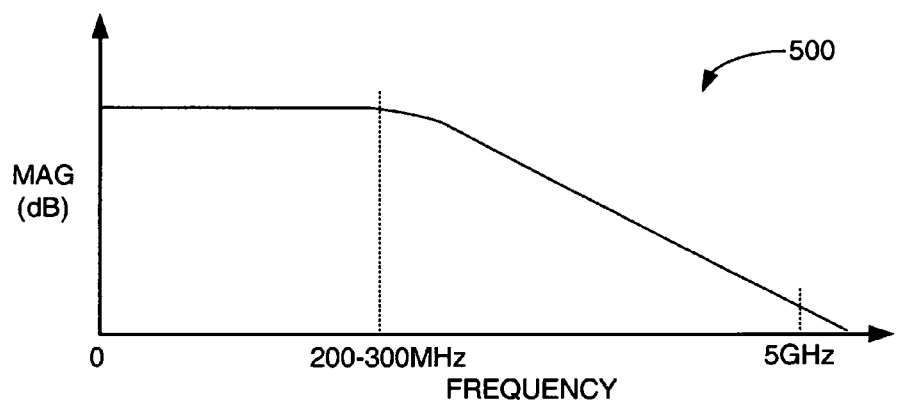
FIG. 5 is a Bode plot 500 depicting an illustrative AC response for combiner circuit 200 of FIG. 2.

FIG. 5 is a Bode plot 500 depicting an illustrative AC response for combiner circuit 200 of FIG. 2A. Inherent capacitances within combiner circuit 200 produce a dominant pole, creating a roll-off frequency of between about 200 and 300 MHz. From the roll-off frequency, the AC response degrades at about 20 dB per decade. The gain of combiner circuit 200 at 200 MHz is more than an order of magnitude greater than at 5 GHz, about 28 dB greater in one embodiment. This significant gain difference produces fluctuations in rise and fall times, and consequently introduces unwanted data-deterministic jitter.

Data combiner 200 switches at relatively low frequencies when producing streams of consecutive ones or zeroes. In such cases, data combiner 200 produces extreme voltage levels due to the relatively high gain at low frequencies. In contrast, combiner 200 switches at a much higher frequency to produce a series of alternating ones and zeroes, and consequently achieves a lower peak-to-peak output level. The shape of signal transitions in output signal OUT therefore depends in part on the preceding data pattern. The gain variation over the bandwidth of interest introduces undesirable data-dependent jitter in the output signal.

Figure 6A:
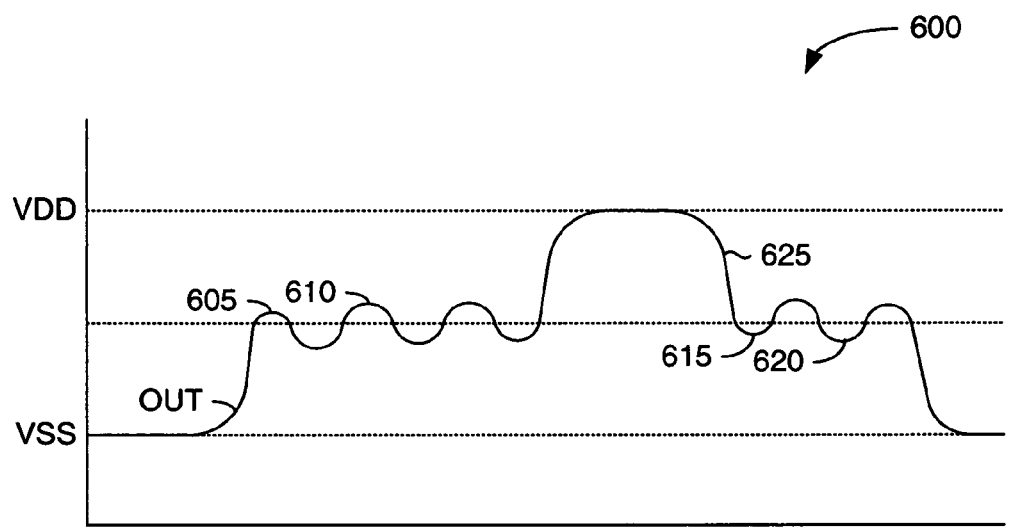
FIG. 6A is a waveform diagram 600 of an output signal OUT from data combiner 200.

FIG. 6A is a waveform diagram 600 of an output signal OUT from data combiner 200, and illustrates how different data patterns can introduce jitter in output signal OUT. The high logic level 605 following first low-to-high transition of diagram 600 is of a different width than the second high logic level 610 following the second low-to-high transition. The same is true of the two low levels 615 and 620 following high-to-low transition 625.

Figure 6B:
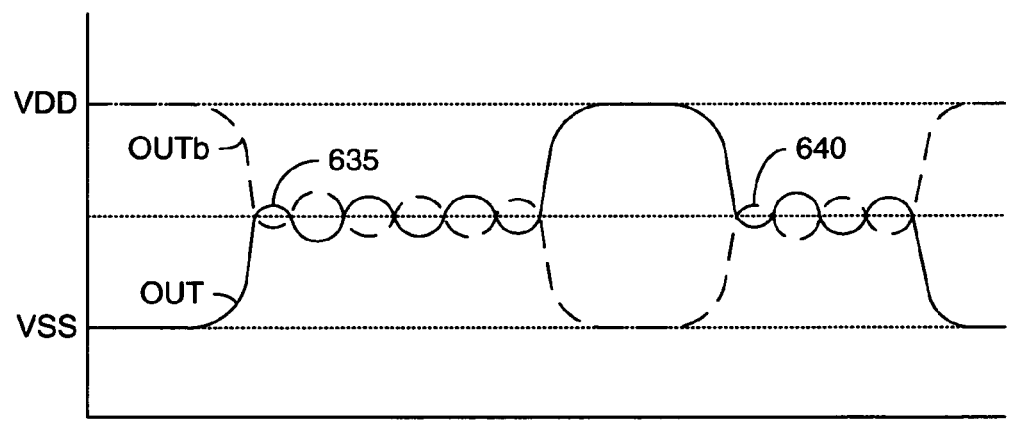
FIG. 6B highlights the data-deterministic jitter using a pair of complementary output signals OUT and OUTb that produce an "eye" pattern.

FIG. 6B highlights the data-deterministic jitter using a pair of complementary output signals OUT and OUTb that produce an "eye" pattern. The two "eyes" 635 and 640 following streams of successive ones and zeros are shorter than those eyes produced by alternating ones and zeros.

The waveforms of FIGS. 6A and 6B are not intended to show the actual impact of data-deterministic jitter on data combiner 200, but are instead intended to illustrate that the output of data combiner 200 depends on both the data combiner's gain curve and on historic data patterns, and that this dependency introduces undesirable data jitter. This problem, and the following solution, is also applicable to other embodiments, including those of FIGS. 3 and 4A.

Figure 7:
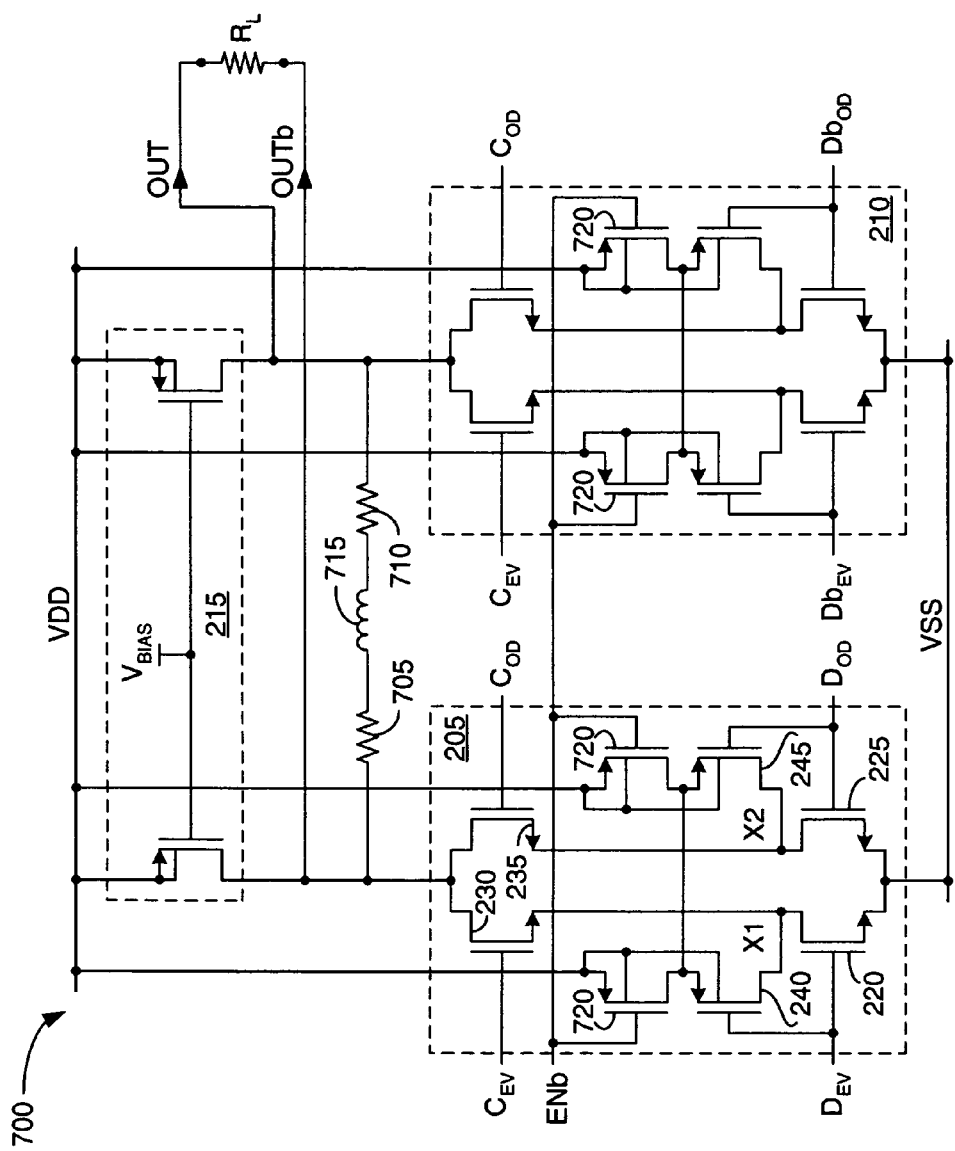
FIG. 7 depicts a data combiner 700 in accordance with an embodiment of the invention that ameliorates the problem of data-deterministic jitter.

FIG. 7 depicts a data combiner 700 in accordance with an embodiment of the invention that ameliorates the problem of data-deterministic jitter. Data combiner 700 is a differential amplifier similar to data combiner 200 of FIG. 2A, like-numbered elements being the same or similar. In addition to the components of data combiner 200, data combiner 700 includes a pair of resistors 705 and 710, an inductor 715, and four PMOS transistors 720. The resistors and inductor flatten the AC response of data combiner 700 to reduce data-deterministic gain jitter; the additional PMOS transistors enable and disable data combiner 700 in response to an active-low enable signal on line ENb. The description of the logical operation of data combiner 700 is similar to that of data combiner 200 and is therefore omitted here for brevity.

Figure 8:
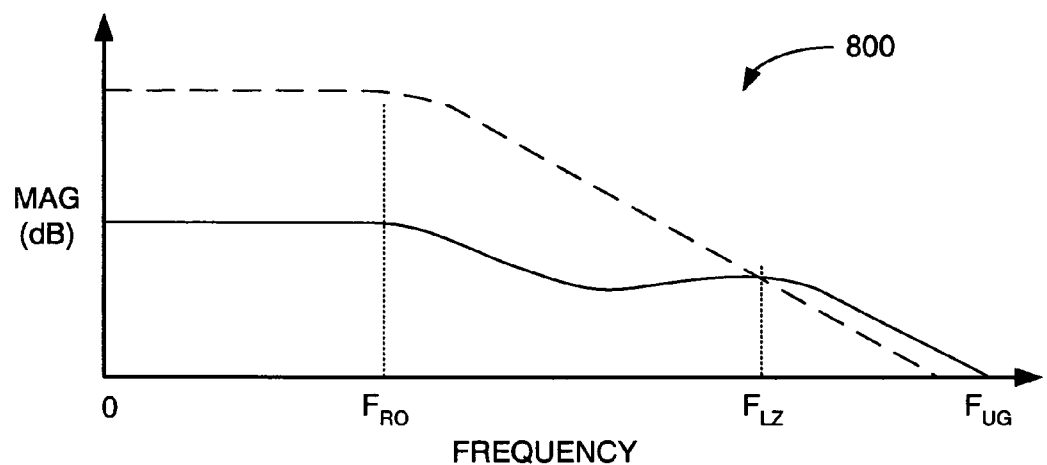
FIG. 8 is a Bode plot 800 depicting the AC response of data combiner 700 of FIG. 7.

FIG. 8 is a Bode plot 800 depicting the AC response of data combiner 700 (FIG. 7) from DC to a unity-gain frequency $F_{UG}$. For comparison, FIG. 8 also includes the AC response of data combiner 200 (FIG. 2) as a dashed line.

Returning to FIG. 7, inductor 715 acts as a short at relatively low frequencies, and thus reduces the low-frequency gain of data combiner 700. The amount of gain reduction depends on the value of the load resistance $R_L$ and the values selected for resistors 705 and 710. In one embodiment, the inclusion of inductor 715 and resistors 705 and 710 reduces the DC gain by over 20 dB, e.g. from about 40 dB to about 15 dB. As with the similar data combiner 200, inherent capacitances within combiner circuit 700 produce a dominant pole, creating a roll-off frequency $F_{RO}$ of between about 200 and 300 MHz.

Inductor 715 introduces a zero at a zero frequency $F_{LZ}$ between the roll-off frequency $F_{RO}$ and the unity gain frequency $F_{UG}$. In one embodiment, the zero frequency $F_{LZ}$ is greater than one gigahertz, e.g. about two gigahertz. The value of inductor 715 is selected to flatten the high-frequency gain, in one embodiment providing an AC response of about 3 dB at the 5 GHz maximum operating frequency. As a consequence of resistors 705 and 710 retarding the low-frequency gain and inductor 715 flattening the high-frequency gain of interest, the AC response of combiner circuit 700 varies by less than 10 dB between the roll-off frequency $F_{RO}$ and the zero frequency $F_{LZ}$. The resulting relatively flat AC response over the frequency band of interest reduces the data-deterministic jitter.

Figure 9:
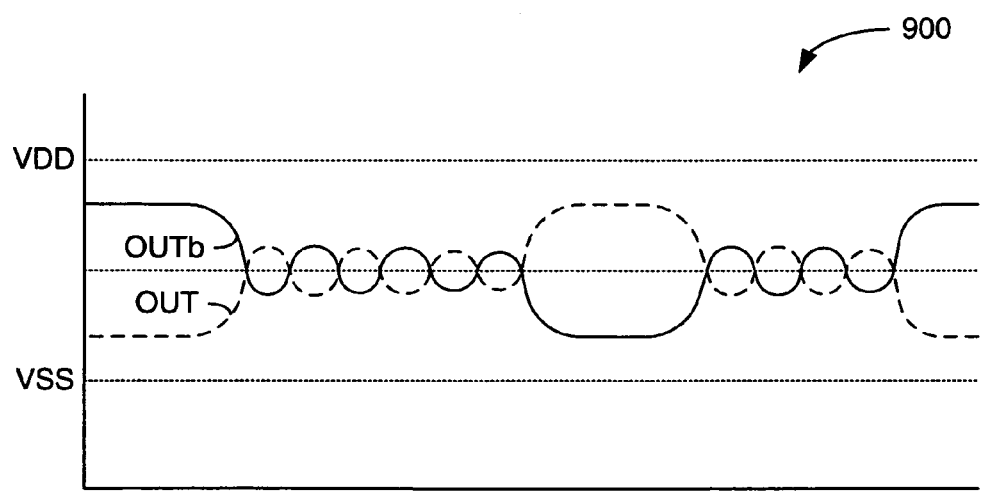
FIG. 9 is a waveform diagram 900 illustrating complementary output signals OUT and OUTb of data combiner 700 of FIG. 7.

FIG. 9 is a waveform diagram 900 illustrating the complementary output signals on differential output terminals OUT and OUTb of data combiner 700 of FIG. 7. In comparison with the similar response of data combiner 200 depicted in FIG. 6B, there is less variation in the eye pattern of waveform 900 because the flatter AC response produces less data-deterministic jitter.

In one embodiment, data combiner 700 is fabricated using a standard 0.18-micron CMOS process in which VSS and VDD are zero and 1.8 volts, respectively. Current source 215 is biased to produce 4.59 mA per side using a pair of PMOS transistors, each with an aspect ratio of 54.0; transistors 230, 235, 220, and 225 are NMOS transistors, also having an aspect ratio of 54.0; transistors 240 and 245 are PMOS transistors with an aspect ratio of 13.52; transistors 720 are PMOS transistors with aspect ratios of 40.18; resistors 705 and 710 are 180.52 Ohms each; and inductor 715 is 14.076 nanohenrys.

While the present invention has been described in connection with specific embodiments, variations of these embodiments will be obvious to those of ordinary skill in the art. For example, while the above-embodiments serialize two- and eight-bit data presented in parallel, the present invention can be extended to serialize parallel data represented using different numbers of bits. Also, the benefits of leveling the AC response provided on differential output terminals can be provided to other types of differential amplifiers. Moreover, some components are shown directly connected to one another while others are shown connected via intermediate components. In each instance, the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A differential amplifier providing an AC response over a frequency bandwidth, the AC response exhibiting a dominant pole at a roll-off frequency and unity gain at a unity-gain frequency, the amplifier comprising:
   a first differential output terminal;
   a second differential output terminal;
   a first resistor of a resistance value and having:
      a first resistor terminal connected to the first differential output terminal; and
      a second resistor terminal;
   an inductor having:
      a first inductor terminal connected to second resistor terminal; and
      a second inductor terminal;
   a second resistor of the resistance value and having:
      a third resistor terminal connected to the second differential output terminal; and
      a fourth resistor terminal connected to the second inductor terminal;
   wherein the inductor has an inductance value selected to introduce a zero in the AC response at a zero frequency between the roll-off frequency and the unity-gain frequency.

2. The differential amplifier of claim 1 driving a load connected between the first and second differential output terminals and exhibiting a low-frequency gain and a roll-off frequency gain, wherein the resistance value reduces the low frequency gain by at least 20 dB.

3. The differential amplifier of claim 1, wherein the resistance value provides a first gain value at the roll-off frequency, the inductance value provides a second gain at the zero frequency, and wherein the first and second gain values differ by less than 10 dB.

4. The differential amplifier of claim 1, wherein the roll-off frequency is less than five percent of the unity-gain frequency.

5. The differential amplifier of claim 4, wherein the roll-off frequency is at least 150 MHz.

6. The differential amplifier of claim 4, wherein the unity-gain frequency is at least 5 GHz.

7. The differential amplifier of claim 1, wherein the zero frequency is at least 1 GHz.

8. The differential amplifier of claim 1, wherein the inductor exhibits an inductance value of at least ten nanohenrys.

9. The differential amplifier of claim 1, wherein the differential amplifier exhibits a unity gain bandwidth, and wherein the unity gain bandwidth is at least fifteen percent greater with resistance value than without.

* * * * *